(12) United States Patent
Classen

(10) Patent No.: US 8,850,890 B2
(45) Date of Patent: Oct. 7, 2014

(54) INERTIAL SENSOR AND METHOD FOR MANUFACTURING AN INERTIAL SENSOR

(75) Inventor: Johannes Classen, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 420 days.

(21) Appl. No.: 13/197,338

(22) Filed: Aug. 3, 2011

(65) Prior Publication Data

US 2012/0031186 A1  Feb. 9, 2012

(30) Foreign Application Priority Data

Aug. 3, 2010 (DE) .......................... 10 2010 038 809

(51) Int. Cl.
*G01P 15/125* (2006.01)
*B81B 3/00* (2006.01)
*G01P 15/08* (2006.01)

(52) U.S. Cl.
CPC ......... *G01P 15/08* (2013.01); *G01P 2015/0831* (2013.01); *G01P 15/0802* (2013.01); *B81B 2201/0242* (2013.01); *B81B 3/0045* (2013.01); *G01P 15/125* (2013.01); *B81B 2203/0154* (2013.01); *G01P 2015/086* (2013.01)

USPC ........................ 73/514.32; 73/514.37; 438/50

(58) Field of Classification Search
CPC .............. G01P 15/0802; G01P 15/125; G01P 2015/0831; G01P 2015/0834; G01P 2015/086
USPC ................. 73/514.32, 514.36, 514.37; 438/50
See application file for complete search history.

(56) References Cited

U.S. PATENT DOCUMENTS

| 4,736,629 A * | 4/1988 | Cole .......................... 73/514.32 |
| 6,552,991 B1 | 4/2003 | Ishioka et al. |
| 6,831,765 B2 * | 12/2004 | Yasuda et al. .............. 359/224.1 |

FOREIGN PATENT DOCUMENTS

EP          1 234 799        8/2002

* cited by examiner

*Primary Examiner* — John Chapman, Jr.
(74) *Attorney, Agent, or Firm* — Kenyon & Kenyon LLP

(57) ABSTRACT

An inertial sensor includes a substrate, a mass element, and a detecting device for detecting a movement of the mass element relative to the substrate, the mass element being coupled to the substrate with the aid of a spring device, wherein the spring device has a T-shaped cross-sectional profile. A method for manufacturing an inertial sensor is also disclosed.

16 Claims, 6 Drawing Sheets

PRIOR ART

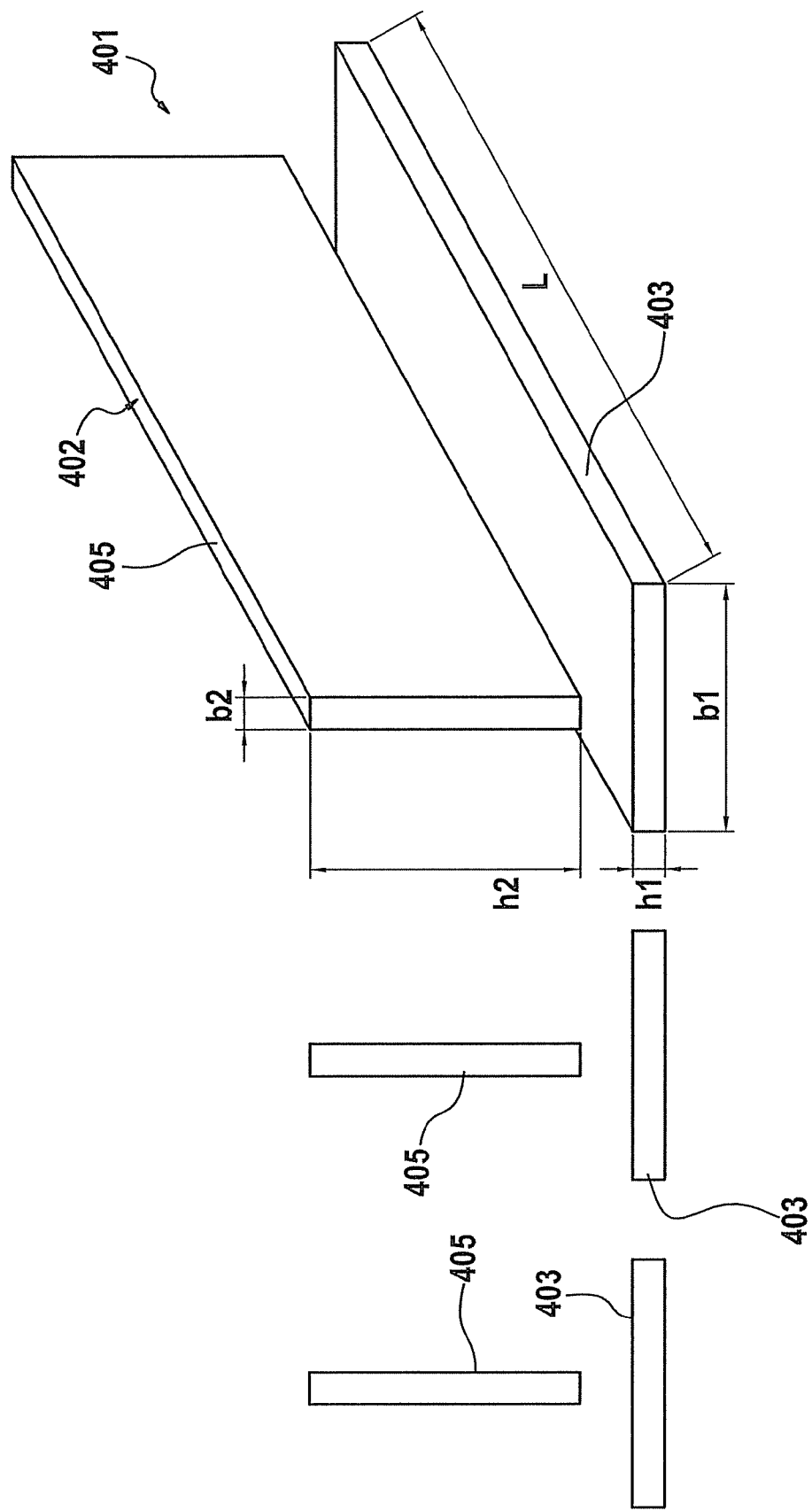

INERTIAL SENSOR AND METHOD FOR MANUFACTURING AN INERTIAL SENSOR

CROSS-REFERENCE TO RELATED APPLICATIONS

The present application claims priority to Application No. 10 2010 038 809.2, filed in the Federal Republic of Germany on Aug. 3, 2010, which is expressly incorporated herein in its entirety by reference thereto.

FIELD OF THE INVENTION

The present invention relates to an inertial sensor and a method for manufacturing an inertial sensor.

BACKGROUND

Inertial sensors as such are known and make it possible, in particular, to measure translational and/or rotational changes in movement. Inertial sensors that measure translational acceleration forces may also be referred to as acceleration sensors. Inertial sensors that measure rotational acceleration forces may also be referred to as rotational acceleration sensors. Inertial sensors that measure angular velocities during rotational movements may also be referred to as yaw rate sensors.

Known inertial sensors, in particular micromechanical inertial sensors, i.e., inertial sensors that have dimensions in the micrometer range, usually include a spring-mass system. In surface micromechanics, for example, the mass, which may also be referred to as a seismic mass, and the springs are etched from a functional layer, for example a silicon functional layer, which has layer thicknesses, in particular, between 10 μm and 20 μm. Since the usual structure widths in micromechanics range between 1 μm and 5 μm, the springs are much higher, than they are wide, i.e., an aspect ratio (the ratio between height and width) is much greater than 1. Springs of this type have a high rigidity in the Z direction, i.e., parallel to height. However, such springs are also very flexurally resilient in the X direction and are therefore frequently used as bending springs in the lateral direction, i.e., in the X direction.

Alternatively, a spring of an inertial sensor may also be formed in an additional functional layer in the sensor core. Since this additional functional layer in the sensor core is much thinner than the aforementioned functional layer, the spring provided in the sensor core has an aspect ratio of much less than 1. Springs of this type, however, are obviously not only torsionally resilient but also flexurally resilient in the Z direction, while they are very flexurally rigid in the lateral direction.

However, the disadvantage of the known springs is, for example, that they are simultaneously flexurally resilient in the lateral direction (first alternative) or in the vertical direction (second alternative), so that these springs are not well suited for use as torsion springs, since the movable torsion mass undergoes deflection under lateral and vertical acceleration forces. This may result in undesirable interference signals or even striking against the structure.

In this regard, optical microscanners and optical CD read/write devices having T-profile springs are known from unexamined European Patent Application EP 1 234 799 A2 and from U.S. Pat. No. 6,552,991 B1, to which a micromirror is attached which may be tilted in different directions with the aid of suitable driving electrodes.

SUMMARY

The object of the present invention may therefore be seen in providing an inertial sensor which overcomes the aforementioned disadvantages and has a high flexural rigidity simultaneously in the lateral and vertical directions.

A further object of the present invention is to specify a method for manufacturing an inertial sensor.

These objects are achieved by the inertial sensor and the method according to the example embodiments described herein.

Example embodiments of the present invention include the concept of providing an inertial sensor, in particular a micromechanical inertial sensor, preferably a surface micromechanical inertial sensor which includes a substrate, preferably a semiconductor substrate, and a mass element. The mass element may preferably also be referred to as a seismic mass element. In particular, multiple mass elements may also be provided. Furthermore, a detecting device is provided according to the present invention, which is preferably situated on the substrate. The detecting device is configured in such a way that it is able to detect a movement of the mass element relative to the substrate. For example, the detecting device is situated above the mass element. In particular, the detection element is situated in a cap wafer. The detecting device preferably includes one or more detecting electrodes which are preferably situated on the substrate. For example, a change in capacitance may be detected on the basis of a change in the distance between the detecting device, in particular the detecting electrode or detecting electrodes, and the mass element. This change in capacitance may then be converted into a movement of the mass element with the aid of an evaluation electronic system. In this case, the mass element acts, in particular, as a counter electrode to the detecting electrode or the detecting electrodes.

According to the present invention, the mass element is coupled to the substrate with the aid of a spring device having a T-shaped cross-sectional profile. The mass element is preferably situated above the detecting device. In a further preferred specific embodiment, the mass element is situated beneath the detecting device. According to the present invention, the coupling between the mass element and the substrate preferably takes place with the aid of a torsion spring which has a T-shaped cross-sectional profile. The spring has a cross-sectional profile in the shape of a T, so to speak. A spring of this type may also be referred to as a T-profile spring. The T-profile spring preferably has a base layer and a web which is situated on the base layer perpendicularly to the base layer. If multiple mass elements are provided, these mass elements may be coupled to the substrate, in particular with the aid of multiple torsion springs having a T-shaped cross-sectional profile. In particular, it may be provided that the base layer and the web are not connected to each other, i.e., they are situated at a distance from each other. According to another example embodiment, it may be provided that the base layer and the web are connected to each other in a number of subareas, while in other subareas they are not connected to each other, i.e., recesses are also provided between the base layer and the web. The spring device thus includes the torsion spring or the base layer and the web.

In the discussion below, the three spatial axes, i.e., the X, Y and Z axes, are defined as follows. The X axis and the Y axis lie on the substrate plane. The Z axis lies perpendicular to the X and Y axes and thus perpendicular to the substrate plane.

The inertial sensor may be, for example, a yaw rate sensor, a rotational acceleration sensor or an acceleration sensor, in particular a Z acceleration sensor. This means that the translational and/or rotational acceleration forces may be detected in or around the Z direction. In general, however, translational and/or rotational acceleration forces may be detected in or around all three spatial axes with the aid of the inertial sensor according to the present invention.

According to particularly preferred example embodiments of the inertial sensor, the mass element has an asymmetrical mass distribution. This means that the geometric central point of the mass element does not coincide with the center of mass of the mass element. This makes it possible to particularly effectively suppress spurious modes in an advantageous manner.

The mass element preferably has a recess in which the spring device is situated. In particular, the recess may be formed symmetrically or asymmetrically around the geometric center point or around the center of mass. Symmetrical or asymmetrical in this context may be, for example, a rotational symmetry. In particular, the recess may make it possible to advantageously reduce the weight.

According to further example embodiments of the inertial sensor, it may be provided that the spring device and the mass element are integrally formed. This advantageously makes it possible to provide a particularly compact design.

In other preferred specific example embodiments of the inertial sensor, the spring device is suspended on the substrate with the aid of an anchoring means. The anchoring means is attached, for example, in an area on or in the substrate. The spring device, in turn, is attached in a further area of the anchoring means, which is located at a distance from the area on or in the substrate so that the spring device is suspended above the substrate. Due to the coupling according to the present invention between the substrate and the mass element, the mass element is consequently also suspended above the substrate. A central suspension of the mass element is preferably provided with the aid of the anchoring means, i.e., the anchoring means is attached in a central location or in the middle of the spring device, in particular on the torsion spring.

Due to the spring device according to the present invention, which has a T-shaped cross-sectional profile and which has a very high flexural rigidity in both the lateral and vertical directions, the inertial sensor is insensitive to spurious accelerations in the lateral and vertical directions, compared to the known inertial sensors.

Furthermore, it is advantageously possible to more easily implement a higher natural frequency of the inertial sensor, since the T-shaped cross-sectional profile has a higher torsional rigidity.

The present invention furthermore includes the idea of specifying a method for manufacturing an inertial sensor, in particular a micromechanical inertial sensor, preferably a surface micromechanical inertial sensor, having a spring device which has a T-shaped cross-sectional profile. The spring device includes, in particular, a torsion spring, which has, in particular, a base layer and a web which is situated on the base layer perpendicularly thereto.

A substrate, preferably a semiconductor substrate, is initially provided, which preferably also includes a detecting device situated on the substrate. A first layer is then deposited onto the substrate. The first layer is subsequently structured. In particular, the width of the base layer of the torsion spring is structured or defined.

In a next step, an oxide layer is deposited onto the base layer, the oxide layer preferably being opened in predetermined areas. In particular, the predetermined areas correspond to the width of the web. A second layer is subsequently deposited onto the opened or unopened oxide layer. In this case, the second layer bonds to the first layer in the predetermined opened areas, if the oxide layer was previously opened. The second layer is located on the oxide layer in the non-opened areas.

According to example embodiments of the present invention, the second layer is then structured, for example with the aid of trenching or a trench process. The perpendicular web of the T-profile spring is formed. In particular, the portion of the second layer which is located on the oxide layer is removed thereby. The removal may be carried out, for example, with the aid of an etching process, in particular with the aid of SF6, the oxide layer serving as an etch stop.

According to example embodiments of the method, it may be provided that a further oxide layer is deposited onto the substrate before the first layer is deposited. In particular, the further oxide layer may be deposited onto a detecting device which is connected to the substrate. In a further preferred embodiment of the method, the first layer is perforated. This means that perforation holes, in particular, are formed in the first layer. In particular, this makes it advantageously possible to particularly easily remove the further oxide layer beneath the first layer, for example with the aid of an etching process, preferably with the aid of gaseous HF. The perforations have only a slight to negligible effect on the torsional rigidity.

In a further example embodiment, the detecting device is preferably formed by depositing a corresponding detecting functional layer onto the substrate. For example, one or more printed conductors may be formed in the detecting functional layer. The detecting functional layer may thus also be referred to as a printed conductor plane.

The aforementioned layers, in particular the first layer, the second layer and the base layer, may be made of silicon, preferably of polysilicon. Germanium may also be preferably used as the layer material.

With the aid of the method according to example embodiments of the present invention, a raw offset spread, in particular, may be reduced during manufacturing. This means that a uniformly high quality may be achieved over a plurality of inertial sensors.

The present invention is explained in greater detail below on the basis of preferred specific embodiments with reference to figures.

BRIEF DESCRIPTION OF THE DRAWINGS

FIG. 4*b* shows a further spring device according to the present invention.

DETAILED DESCRIPTION

Figure 1:
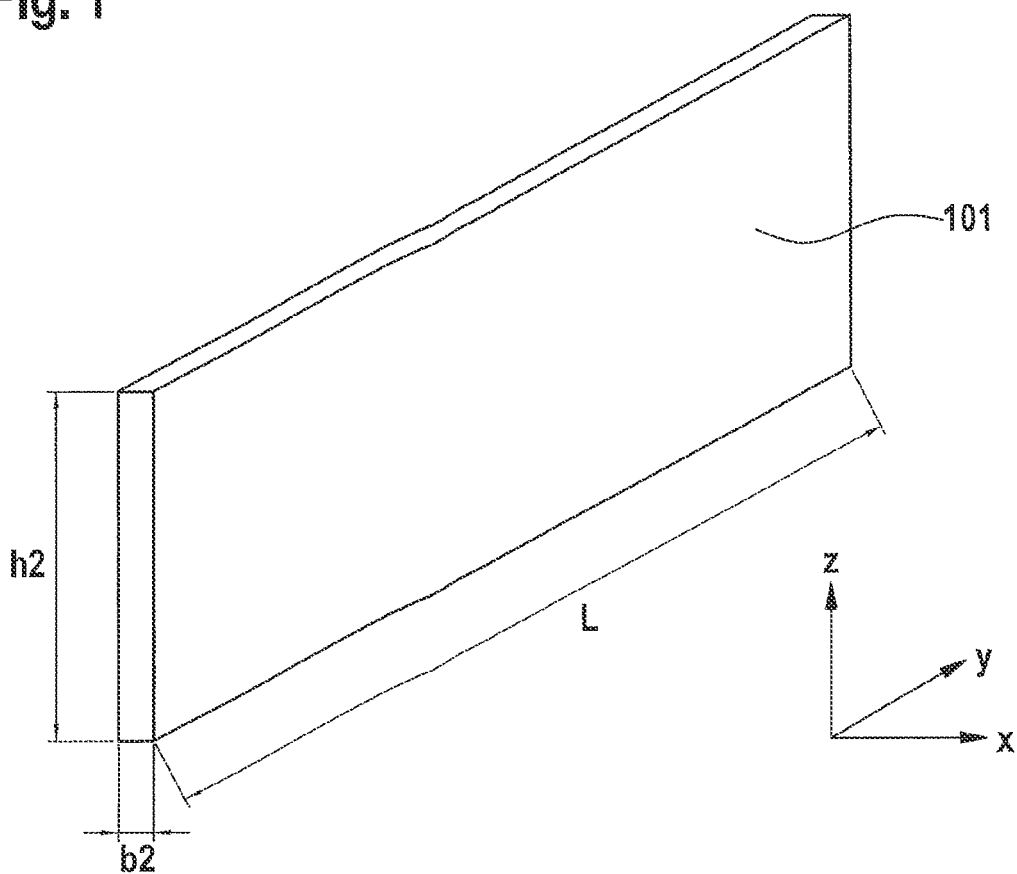
FIG. 1 shows a torsion spring according to the related art.

In the discussion below, the same reference numerals are used for the same elements in the drawings.

FIG. 1 shows a torsion spring 101 according to the related art. Torsion spring 101 has a length L, a width b2 and a height h2. Width b2 is between 1 μm and 5 μm. As is clearly apparent, the aspect ratio, i.e., the ratio between the height and the width, i.e., h2/b2, is greater than 1. Torsion spring 101 has a high rigidity in the Z direction but is very flexurally resilient in the X direction. This may be disadvantageous, since undesirable deflections, which may result in signal corruptions, may occur in the X direction, for example if accelerations occur in the X direction. Since torsion spring 101 has a bar shape, torsion spring 101 may also be referred to as a bar spring.

Figure 2:
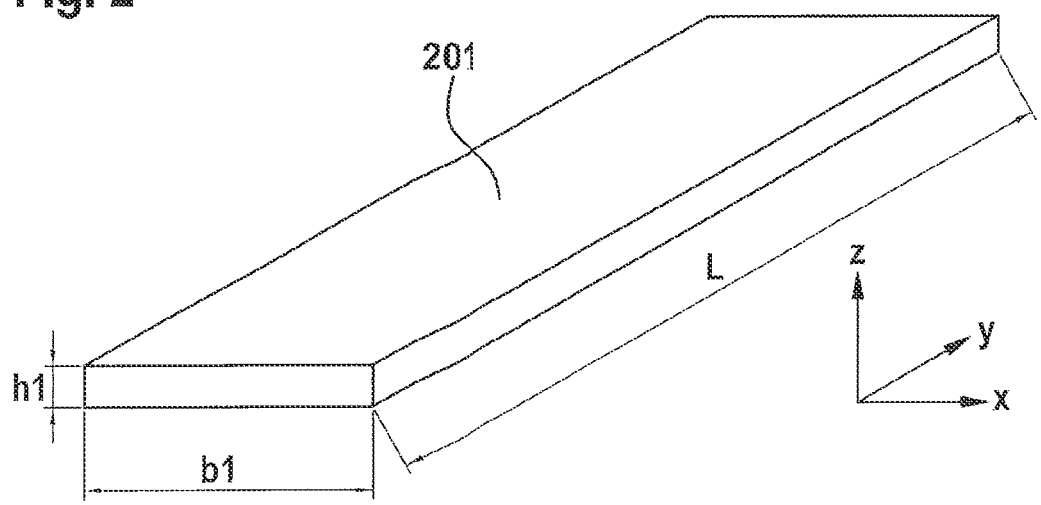
FIG. 2 shows a further torsion spring according to the related art.

FIG. 2 shows a further torsion spring 201 according to the related art. Torsion spring 201 has a length L, a width b1 and a height h1. In this case, the aspect ratio, i.e., h1/b1, is less than 1. A spring of this type is typically functionalized or formed in an additional functional layer in the sensor core. Torsion spring 201 is not only torsionally resilient but also flexurally resilient in the Z direction, while it is very flexurally rigid in the lateral direction, i.e., in the X direction. Since torsion spring 201 has a bar shape, torsion spring 201 may also be referred to as a bar spring in a manner similar to torsion spring 101.

Figure 3:
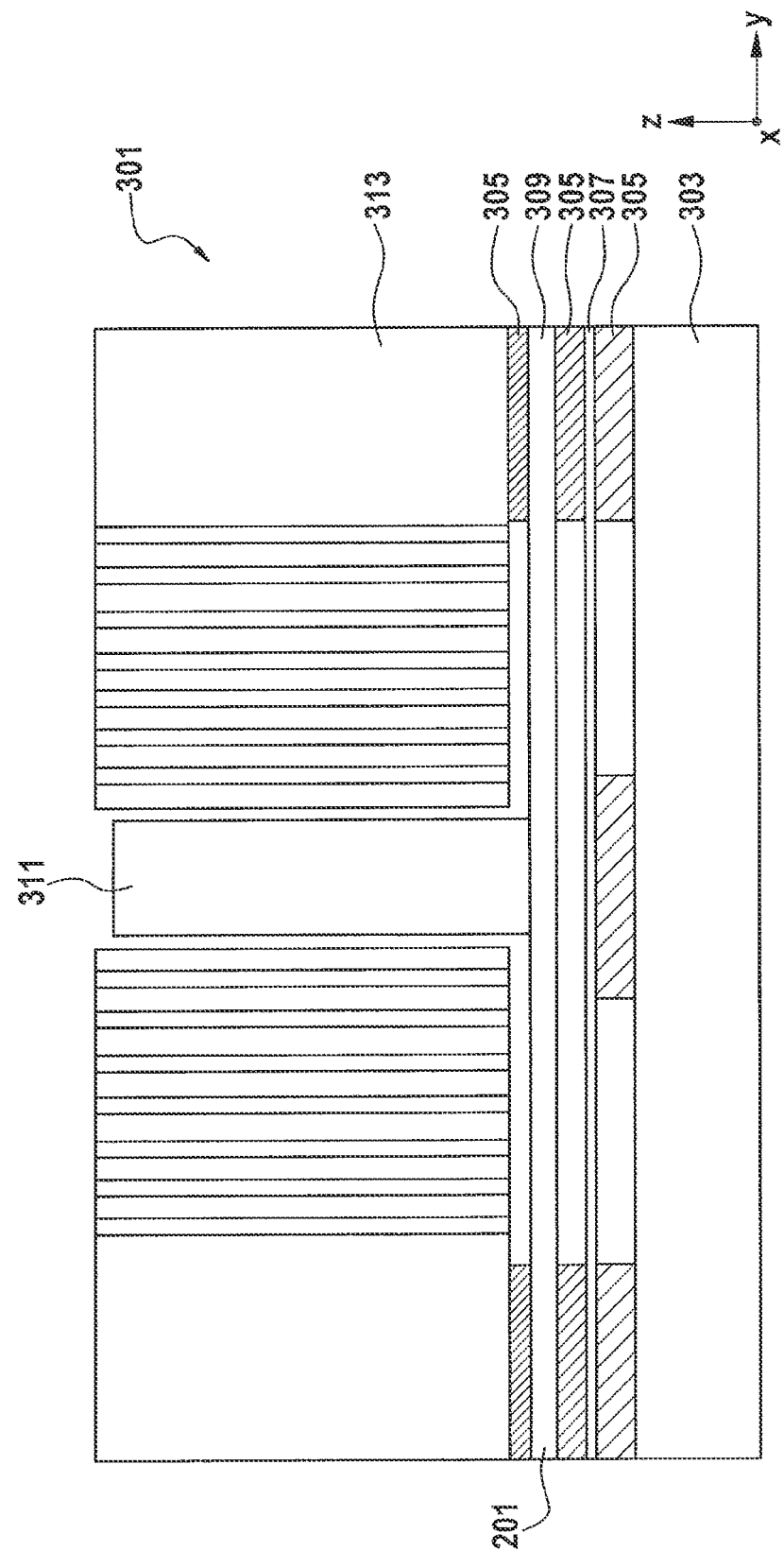
FIG. 3 shows an inertial sensor having the torsion spring from FIG. 2.

FIG. 3 shows an inertial sensor 301 having a substrate 303. Oxide layers 305 (illustrated as hatched areas) are deposited onto substrate 303. Oxide layers 305 may also be referred to as sacrificial oxide layers. A conducting layer 307 is deposited onto oxide layer 305. Conducting layer 307 includes, for example, one or more electrodes (not illustrated). For example, the electrodes in this case may be formed as flat electrodes. Conducting layer 307 may thus also be referred to, in particular, as a printed conductor plane. Oxide layers 305 are also deposited onto conducting layer 307. In this regard, it should be noted that oxide layers 305 are not always formed in a contiguous manner but may have gaps or recesses, i.e., free areas. Oxide layers were also formed in these free areas during the manufacturing process. However, these oxide layers were removed in one or more etching processes.

In the sensor core, a silicon layer 309 is deposited onto oxide layers 305 which are deposited onto conducting layer 307, and this silicon layer was functionalized thereon.

Torsion spring 201 from FIG. 2 is also formed from this layer. A mass element 311 is situated in a subarea of layer 309. Both the subarea of layer 309 and mass element 311 are thus situated in a movable manner and form a movable structure. Oxide layers 305, onto which a further silicon layer 313 is deposited, are deposited onto layer 309. The height of further silicon layer 313 is greater than the height of mass element 311.

Figure 4A:
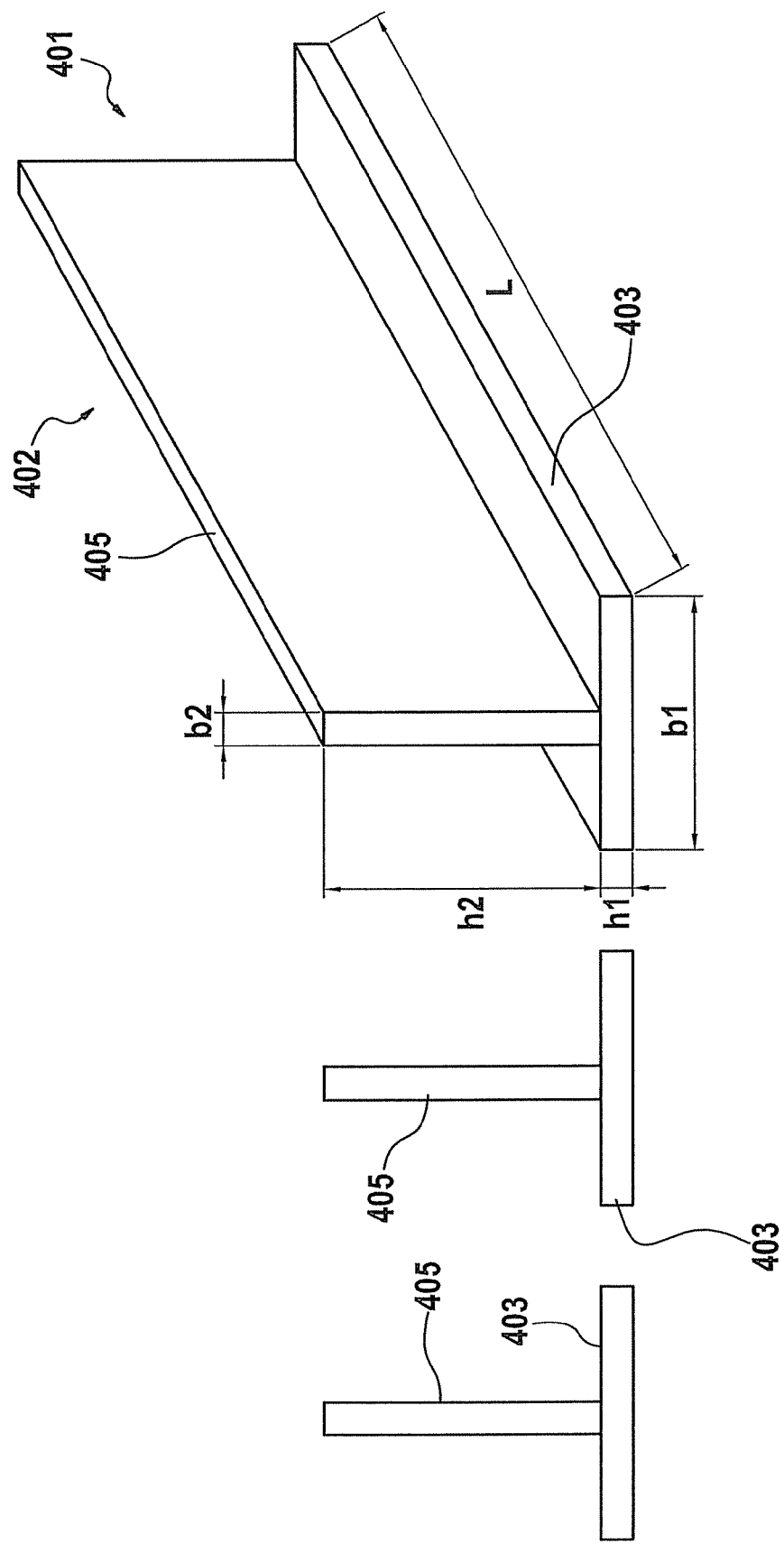
FIG. 4*a* shows a spring device according to the present invention.

FIG. 4a now shows a spring device 401 according to the present invention. Spring device 401 includes a torsion spring 402 and has a base layer 403 and a web 405 situated perpendicularly on base layer 403. Base layer 403 has a length L, a width b1 and a height h1. Web 405 has a length L, a width b2 and a height h2. Torsion spring 402 has a T-shaped cross section. Torsion spring 402 may thus also be referred to as a T-profile torsion spring. Torsion spring 402 is preferably made of silicon, in particular, a polysilicon. For example, torsion spring 402 may also be made of germanium or other semiconductor materials.

The flexural and torsional rigidity of bar springs 101, 201 from FIGS. 1 and 2 and of torsion spring 402 in FIG. 4a may be calculated analytically (refer to Roarks, Formula for Stress and Strain, 6th edition (1989)). For the sake of clarity, a formulaic representation is omitted here. Instead, reference is made to the aforementioned document. Some of the results of this analytical calculation are summarized below. The calculations were based, by way of example, on the following dimensions for the springs, it being possible to also use these dimensions as real dimensions for the springs:
h1=2 μm
h2=20 μm
b1=20 μm
b2=2 μm The torsional rigidity of T-profile spring 402 corresponds approximately to the sum of the torsional rigidities of bar springs 101 and 201. Using torsion spring 402 thus makes it possible to achieve approximately twice the torsional rigidity than using the two individual bar springs 101 and 201. This is advantageous, in particular, for sensors which are manufactured or designed to have a high natural frequency, for example 10 kHz. In addition or as an alternative, the increased rigidity may be compensated by a greater spring length L. In the event of an overload, any maximum stresses which occur in torsion spring 402 may be substantially reduced thereby, and an inertial sensor having a torsion spring 402 of this type is made substantially more robust.

Furthermore, the flexural rigidity of torsion spring 402 is high in the X and Z directions. In the lateral direction, i.e., the X direction, the flexural rigidity largely corresponds to the high lateral flexural rigidity of bar spring 201 from FIG. 2, and it is higher than the lateral flexural rigidity of bar spring 101 from FIG. 1 by a factor of 100 for the geometry specified above. In the vertical direction, i.e., the Z direction, the flexural rigidity is higher than the vertical flexural rigidity of bar spring 101 from FIG. 1 by a factor of 3 and higher than the vertical flexural rigidity of bar spring 201 from FIG. 2 by a factor of 300.

The torsional rigidity of bar spring 101 from FIG. 1 is defined solely by height h2 and effective spring width b2. Similarly, the torsional rigidity of bar spring 201 from FIG. 2 is defined by height h1 and effective spring width b1. All four parameters of T-profile spring 402 from FIG. 4a are incorporated into the torsional rigidity; however, they have a weaker weighting for the upper geometry data by approximately 50 percent in each case. On the whole, this is advantageous for the overall spread, since the four influencing parameters are statistically independent of each other. For example, the statistical addition of four influencing parameters, each having a half spread s/2, yields an overall spread of $((s/2)^2+(s/2)^2+(s/2)^2+(s/2)^2)^{1/2}=2^{1/2}$ s. For torsion spring 402 having the four influencing parameters, a reduction in the overall spread of the torsional rigidity is obtained, for example by a factor of $2^{1/2} \approx 1.4$.

To summarize, a torsion spring having a T-profile, in particular torsion spring 402 from FIG. 4a, has the following advantages.

The torsion springs according to the present invention have a very high flexural rigidity simultaneously in the lateral and vertical directions and are therefore insensitive to spurious accelerations in the lateral and vertical directions, compared to the known bar springs.

Furthermore, the torsion springs according to the present invention may generally have a smaller spring rigidity spread than do the known bar springs. In this regard, the torsional rigidity is approximately proportionate to the third power of the spring width for bar spring 101 from FIG. 1 or to the third power of the spring height for bar spring 201 from FIG. 2. Manufacturing-related spreads of the effective structural width or layer height therefore have a great influence on the resonance frequency and/or the sensitivity of the inertial sensor.

The torsion springs according to the present invention furthermore have an increased torsional rigidity compared to the known bar springs, making it possible, in particular, to also implement inertial sensors having a rocker structure of higher natural frequencies. Rocker structures of this type are usually connected to a substrate or stationary part or surrounding frame structures by two torsional springs. To manufacture inertial sensors having natural frequencies in the order of 10 kHz and sufficiently large masses, the torsion springs must be designed or formed to be extremely wide and/or very short. There are technological limits to the maximum width, since the oxide layers or sacrificial layers beneath the silicon layer must be removed. At present, in particular, this is reliably possible only for widths of less than 10 µm. Very short springs, on the other hand, are problematic, since the breakage stress in the springs could be exceeded when the mass element, i.e. the seismic mass, is deflected to the mechanical stop, for example in the Z direction, in particular during a drop test.

Figure 4C:
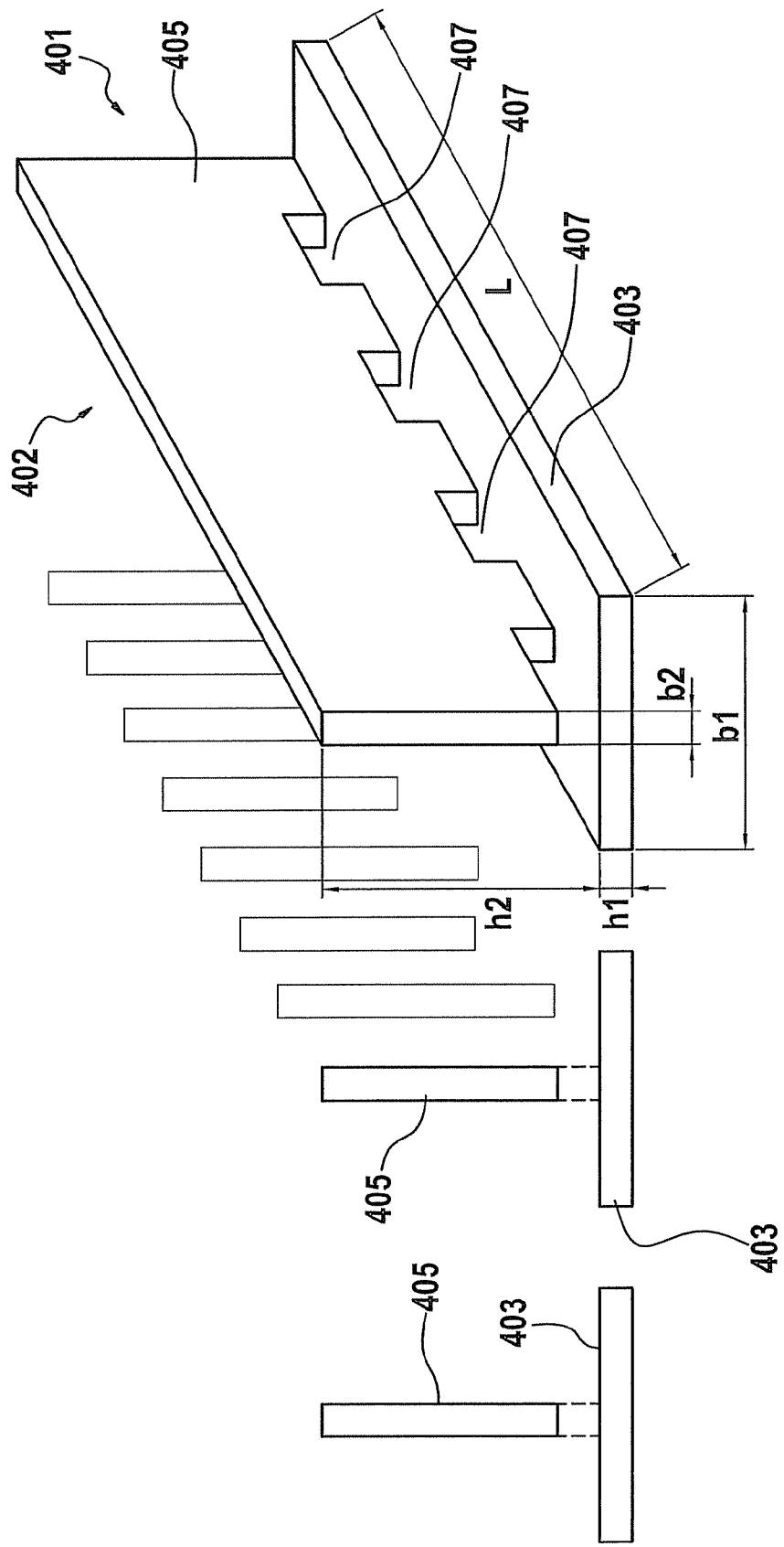
FIG. 4*c* shows another spring device according to the present invention.

FIGS. 4b and 4c show further example embodiments of spring device 401. In the embodiment shown in FIG. 4b, spring device 401 includes a base layer 403 and a web 405, which are situated a distance apart, similarly to FIG. 4a. Base layer 403 and web 405 are thus not connected to each other. In the embodiment shown in FIG. 4c, spring device 401 also includes a base layer 403 and a web 405. Web 405 is at least partially connected to base layer 403. This means that web 405 is connected to base layer 403 along a number of subareas along side L, while it is not connected in other subareas. In this regard, recesses 407 are also formed between web 405 and base layer 403. Base layer 403 and web 405 in this case form a torsion spring 402 having a T-shaped cross-sectional profile.

The calculations regarding spring devices 401 in FIGS. 4b and 4c are similar to the calculations regarding spring device 401 in FIG. 4a. In this regard, corresponding results are similar to each other, and the aforementioned advantages in reference to the specific embodiment in FIG. 4a also apply to the specific embodiments in FIGS. 4b and 4c.

Figure 5:
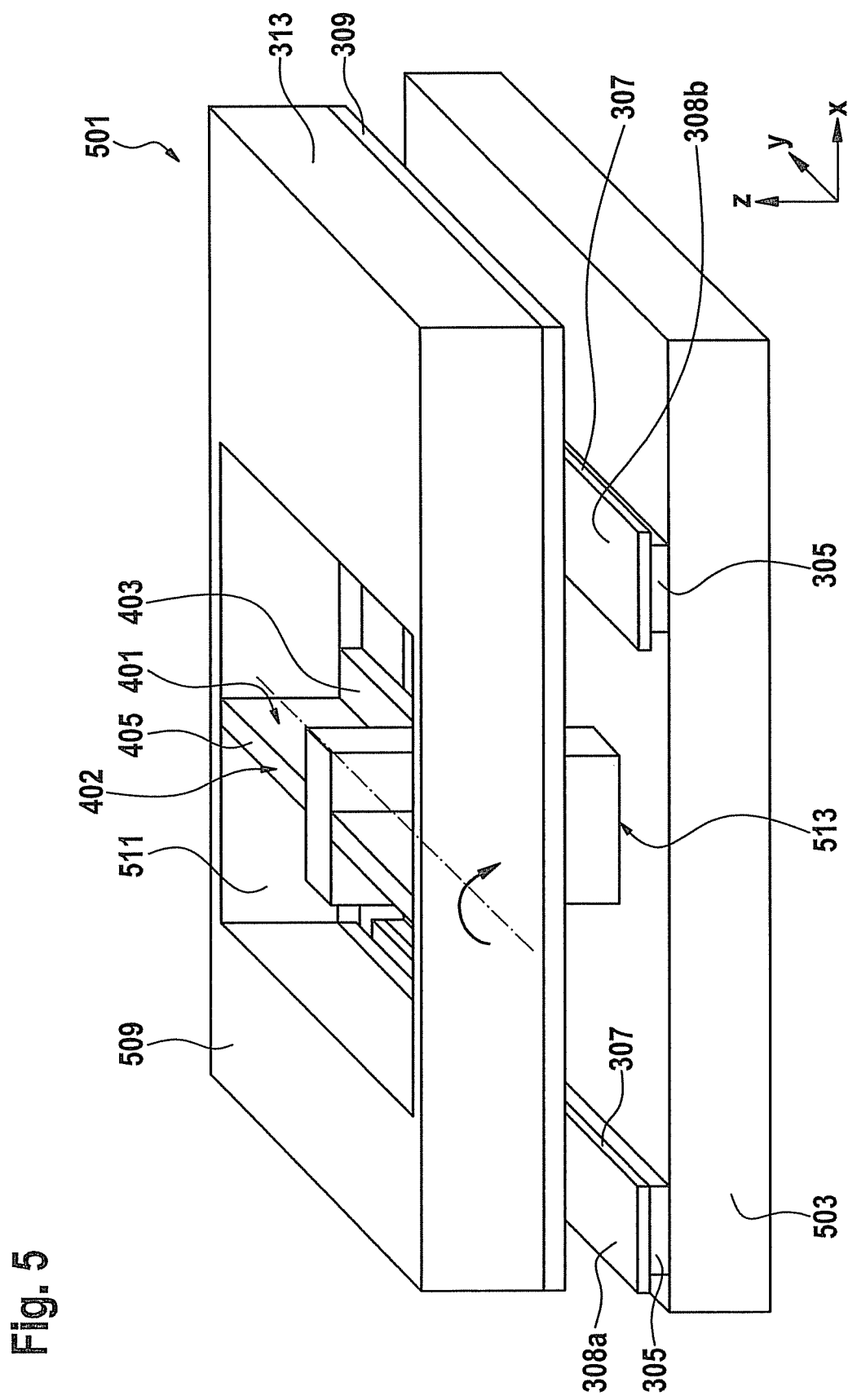
FIG. 5 shows an inertial sensor having the torsion spring from FIG. 4*a*.

FIG. 5 shows spring device 401, which includes torsion spring 402 from FIG. 4a, in an inertial sensor 501. Inertial sensor 501 has a rectangular substrate 503. Oxide layers 305, which electrically insulate conducting layers 307 from substrate 503, are deposited onto substrate 503. Conducting layers 307 each include a flat or strip-shaped detecting electrode 308a and 308b for detecting a movement of a mass element 509. Mass element 509 is cuboid in shape and has a rectangular recess 511. Recess 511 is situated asymmetrically to the geometric center point of cuboid mass element 509. Mass element 509 thus has an asymmetrical mass distribution.

Mass element 509 has a silicon layer 309 and a further silicon layer 313 situated thereupon. In some example embodiments which are not illustrated, these layers may also be made of polysilicon and/or germanium. One layer may preferably be made of silicon, in particular polysilicon, while the other layer is made of germanium.

Torsion spring 402 is situated in recess 511. In this case, length L of torsion spring 402 corresponds to the length of recess 511 in the Y direction. An anchoring means 513, which is connected to substrate 503 or is attached to substrate 503, is situated centrally on torsion spring 402. With the aid of the anchoring means according to the present invention, mass element 509 is suspended above the two detecting electrodes 308a and 308b. Since anchoring means 513 is connected to torsion spring 402 in a central location, this may also be referred to as a central anchoring means.

In the manufacturing method according to the present invention, base layer 403 is formed with the aid of silicon layer 309, and web 405 is formed with the aid of further silicon layer 313. Silicon layer 309 may thus be referred to as a first layer and further silicon layer 313 may thus be referred to as a second layer. The anchoring means may also be formed during the manufacturing method by depositing and/or structuring corresponding layers.

The layers are formed, for example, from a finely crystalline layer, in particular a finely crystalline silicon layer. It is known from tests conducted on different inertial sensors manufactured by the standard OMM process, in particular, acceleration sensors, that substantial pre-deflections of the sensor elements, for example mass elements 311 and 509, from the idle position, so-called raw offsets, may occur even if no acceleration is present. These raw offsets are undesirable, since they may result in premature and asymmetrical striking actions, poorer resistance to vibration and unfavorable temperature behavior (increased temperature responses of the offset). The amount and direction of the pre-deflection are largely determined by the statistical orientation and the size of the crystallite in the layers, in particular in the first and second layers. It has been demonstrated that layers having finer crystallites, for example a first finely crystalline layer, result in much smaller spreads (~ factor of 5 to 10) in the raw offset distribution. To reduce the offset, therefore, it may be particularly advantageous to use a torsion spring which is at least partially formed in the first layer. In particular, base layer 403 is formed in the first layer. Web 405 is preferably formed in the second layer. Torsion spring 402 and mass element 509 are thus integrally formed.

In particular, a height of the first layer ranges between 1 µm and 3 µm. A height of the second layer preferably ranges between 10 µm and 40 µm. The layers may be deposited, for example, with the aid of chemical vapor deposition (CVD), preferably with the aid of chemical low-pressure chemical vapor deposition (LPCVD). In particular, the layers are grown epitaxially or with the aid of epitaxy. In one preferred example embodiment, the first layer is deposited with the aid of LPCVD and the second layer is grown epitaxially or with the aid of epitaxy.

When inertial sensor 501 is accelerated in the direction of the Z axis, mass element 509 will tilt like a rocker around the Y axis, due to the asymmetrical mass distribution (see curved arrow). Mass element 509 may thus also be referred to as a torsion rocker. Due to the tilting or rocking movement, a distance between mass element 509 and detecting electrodes 308a and 308b changes. This change in distance may be detected capacitively and converted into a translational movement of inertial sensor 501 with the aid of an evaluation electronic system, which is not illustrated. Inertial sensor 501 thus forms an acceleration sensor in the Z direction, or a Z acceleration sensor.

In further example embodiments, which are not illustrated, spring device 401 from FIG. 4b or FIG. 4c may also be used in inertial sensor 501.

What is claimed is:
1. An inertial sensor, comprising:
a substrate;
a mass element;
a detecting device configured to detect a movement of the mass element relative to the substrate; and
a spring device, the mass element being coupled to the substrate via the spring device,
wherein the spring device has a T-shaped cross-sectional profile, wherein the mass element includes a recess in which the spring device is situated, and wherein the T-shaped cross-sectional profile has a first portion, closest to the substrate and parallel to the substrate, and a second portion extending from the first portion perpendicularly to the substrate.

2. The inertial sensor as recited in claim 1, wherein the inertial sensor is a micromechanical inertial sensor.

3. The inertial sensor as recited in claim 1, wherein the substrate is a semiconductor substrate.

4. The inertial sensor as recited in claim 1, wherein the mass element has an asymmetrical mass distribution.

5. The inertial sensor as recited in claim 1, wherein the detecting device has at least one detecting electrode situated on the substrate and configured to detect a change in capacitance between the at least one detecting electrode and the mass element.

6. The inertial sensor as recited in claim 1, wherein the spring device and the mass element are integrally formed.

7. The inertial sensor as recited in claim 1, wherein the spring device is suspended on the substrate with the aid of an anchoring element.

8. The inertial sensor as recited in claim 1, wherein:
the first portion is a base,
the second portion is a web, and
the web is joined to the base via a first plurality of subareas of the web and disconnected from the base via a second plurality of subareas of the web.

9. The inertial sensor as recited in claim 8, wherein the second plurality of subareas are recesses in the web.

10. A method of manufacturing an inertial sensor including a spring device having a T-shaped cross-sectional profile, the method comprising:
providing a substrate, a detecting device being situated on the substrate;
depositing a first layer onto the substrate;
structuring the first layer;
depositing an oxide layer onto the structured first layer;
depositing a second layer onto the oxide layer; and
structuring the second layer to form a web which is situated perpendicularly on the first layer.

11. The method as recited in claim 10, wherein the inertial sensor is a micromechanical inertial sensor.

12. The method as recited in claim 10, wherein the substrate is a semiconductor substrate.

13. The method as recited in claim 10, wherein the oxide layer is opened in predetermined areas so that the deposited second layer bonds to the first layer in the predetermined areas.

14. The method as recited in claim 10, wherein the structuring of the first layer includes forming perforations in the first layer.

15. The method as recited in claim 10, wherein a further oxide layer is deposited onto the substrate before the first layer is deposited.

16. The method as recited in claim 15, wherein the oxide layers are removed after the second layer is structured.

* * * * *